United States Patent

Hung et al.

(10) Patent No.: US 9,627,489 B2
(45) Date of Patent: Apr. 18, 2017

(54) SEMICONDUCTOR DEVICE

(71) Applicant: KABUSHIKI KAISHA TOSHIBA, Tokyo (JP)

(72) Inventors: Hung Hung, Nonoichi Ishikawa (JP); Yasuhiro Isobe, Kanazawa Ishikawa (JP); Kohei Oasa, Nonoichi Ishikawa (JP); Akira Yoshioka, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/831,736

(22) Filed: Aug. 20, 2015

(65) Prior Publication Data

US 2016/0211335 A1 Jul. 21, 2016

(30) Foreign Application Priority Data

Jan. 21, 2015 (JP) ................. 2015-009569

(51) Int. Cl.
*H01L 29/205* (2006.01)
*H01L 29/20* (2006.01)
*H01L 29/66* (2006.01)
*H01L 29/36* (2006.01)
*H01L 29/778* (2006.01)
*H01L 29/10* (2006.01)
*H01L 29/207* (2006.01)

(52) U.S. Cl.
CPC ........ *H01L 29/205* (2013.01); *H01L 29/1075* (2013.01); *H01L 29/2003* (2013.01); *H01L 29/36* (2013.01); *H01L 29/66431* (2013.01); *H01L 29/66439* (2013.01); *H01L 29/778* (2013.01); *H01L 29/7786* (2013.01); *H01L 29/207* (2013.01)

(58) Field of Classification Search
None
See application file for complete search history.

(56) References Cited

U.S. PATENT DOCUMENTS

| 6,046,464 | A | * | 4/2000 | Schetzina | H01L 29/205 257/190 |
| 2002/0094002 | A1 | * | 7/2002 | Amano | B82Y 20/00 372/45.01 |
| 2006/0278892 | A1 | * | 12/2006 | Harris | H01L 29/7783 257/194 |
| 2014/0117411 | A1 | * | 5/2014 | Kanaya | H01L 27/0629 257/195 |

FOREIGN PATENT DOCUMENTS

JP 2014-017422 A 1/2014

* cited by examiner

*Primary Examiner* — Fei Fei Yeung Lopez
(74) *Attorney, Agent, or Firm* — Patterson & Sheridan, LLP

(57) ABSTRACT

A semiconductor device includes a first semiconductor layer on a substrate, a second semiconductor layer containing an n-type dopant, on the first semiconductor layer, a third semiconductor layer having a resistance greater than a resistance of the second semiconductor layer, on the second semiconductor layer, a fourth semiconductor layer containing a nitride semiconductor, on the third semiconductor layer, and a fifth semiconductor layer containing a nitride semiconductor having a band gap greater than a band gap of the fourth semiconductor layer, on the fourth semiconductor layer.

20 Claims, 2 Drawing Sheets

SEMICONDUCTOR DEVICE

CROSS-REFERENCE TO RELATED APPLICATION

This application is based upon and claims the benefit of priority from Japanese Patent Application No. 2015-009569, filed Jan. 21, 2015, the entire contents of which are incorporated herein by reference.

FIELD

An embodiment described herein relates to a semiconductor device, and particularly to a semiconductor device which uses a compound semiconductor.

BACKGROUND

A power semiconductor element such as a switching element or a diode is used in a switching power source and a circuit such as an inverter. Such a power semiconductor element is required to possess high breakdown voltage and low ON resistance. Although there is a tradeoff relationship between ON resistance and breakdown voltage based on the semiconductor material of the power semiconductor element, such tradeoff relationship determined based on the material may be improved by using a wide band gap semiconductor such as a nitride semiconductor or a silicon carbide (SiC) as the element material compared to the case where silicon is used as the element material, thus providing a power semiconductor element achieving a high breakdown voltage and a low ON resistance.

An element which uses a nitride semiconductor such as GaN or AlGaN possesses an excellent material characteristic and hence, a power semiconductor element having high performance may be achieved. Particularly, in a HEMT (High Electron Mobility Transistor) having the hetero structure of AlGaN/GaN, a two-dimensional electron gas of high concentration is generated at a boundary between an AlGaN layer and a GaN layer by polarization and hence, the HEMT may achieve a low ON resistance.

DETAILED DESCRIPTION

According to an embodiment, there is provided a semiconductor device which may prevent the breakdown even when a high voltage is applied to the semiconductor device.

In general, according to one embodiment, a semiconductor device includes a first semiconductor layer on a substrate, a second semiconductor layer containing an n-type dopant, on the first semiconductor layer, a third semiconductor layer having a resistance greater than a resistance of the second semiconductor layer, on the second semiconductor layer, a fourth semiconductor layer containing a nitride semiconductor, on the third semiconductor layer, and a fifth semiconductor layer containing a nitride semiconductor having a band gap greater than a band gap of the fourth semiconductor layer, on the fourth semiconductor layer.

Hereinafter, an embodiment is explained by reference to drawings. The drawings are schematic or conceptual views and hence, sizes and ratios of the respective parts in the respective drawings are not always equal to those of an actual semiconductor device. The embodiment described hereinafter merely exemplifies a device and a method for embodying the technical concept of the present disclosure, and the technical concept of the present disclosure is not limited by shapes, structures, dispositions and the like of structural components described in the embodiment. In the explanation made hereinafter, structural elements having the substantially identical functions or structures are given same symbols, and these structural elements are explained repeatedly only when such explanation is necessary.

Figure 1:
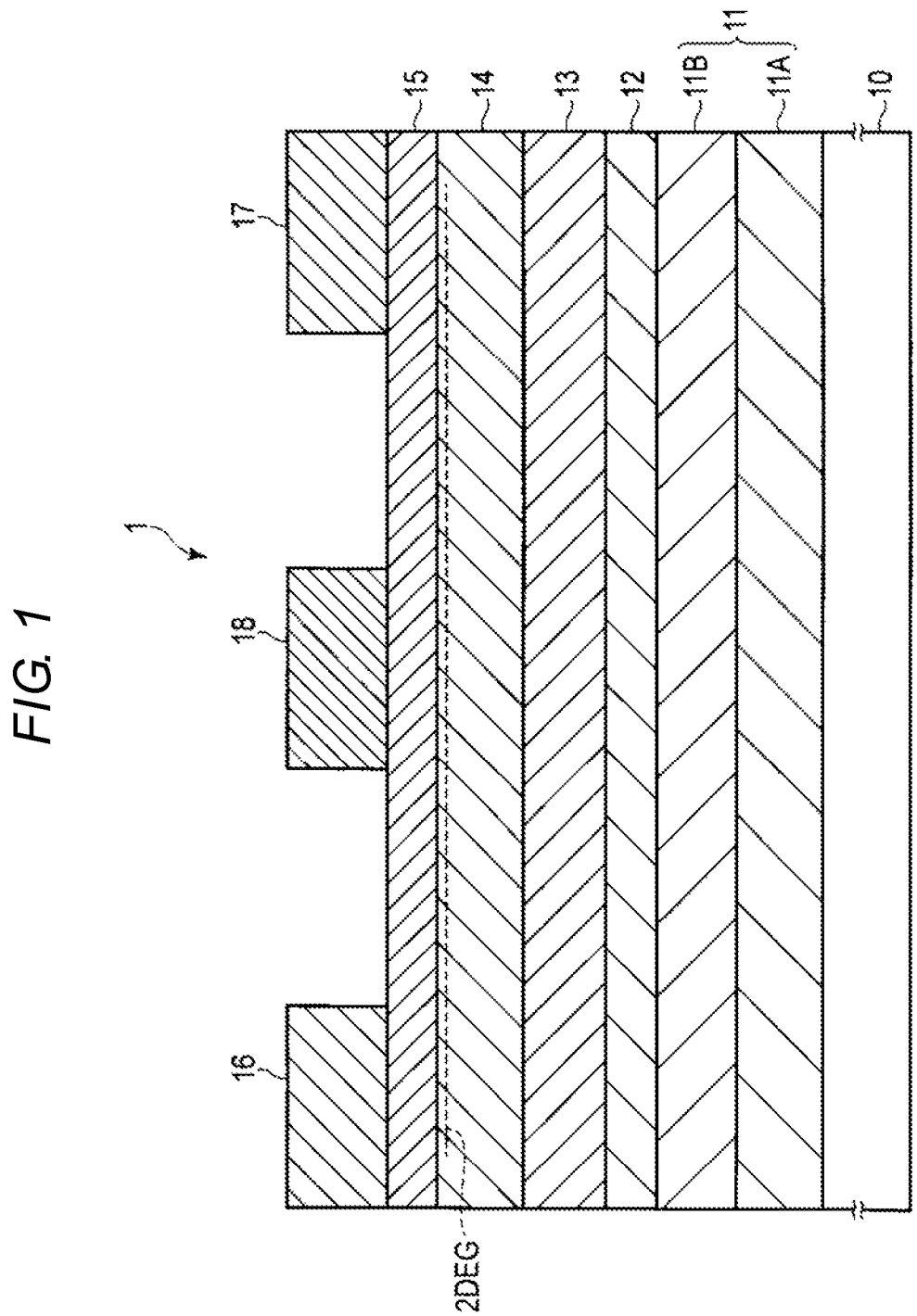
FIG. 1 is a cross-sectional view of a semiconductor device according to an embodiment.

FIG. 1 is a cross-sectional view of a semiconductor device 1 according to the embodiment. The semiconductor device 1 is a compound nitride semiconductor device in which a compound nitride semiconductor is formed on an underlying substrate. The semiconductor device 1 is an FET (Field Effect Transistor). Specifically, the semiconductor device 1 is a HEMT (High Electron Mobility Transistor).

A substrate 10 is formed of a silicon (Si) substrate where a (111) plane forms a main plane, for example. As a material for forming the substrate 10, silicon carbide (SiC), gallium nitride (GaN), gallium phosphide (GaP), indium phosphide (InP), gallium arsenide (GaAs), sapphire ($Al_2O_3$) or the like may be used. A substrate which includes an insulating layer may be used as the substrate 10. For example, an SOI (Silicon On Insulator) substrate may be used as the substrate 10.

A buffer layer 11 is formed on the substrate 10. The buffer layer 11 has a function of alleviating strain caused by the difference between a lattice constant of a nitride semiconductor layer formed on the buffer layer 11 and a lattice constant of the substrate 10, and also has a function of controlling crystallinity of the nitride semiconductor layer formed on the buffer layer 11. The buffer layer 11 is made of $Al_xGa_{1-x}N$ ($0 \leq X \leq 1$), for example.

The buffer layer 11 may be formed by stacking, or depositing or growing, a plurality of layers made of $Al_xGa_{1-x}N$ which have different composition ratios one atop the other. When the buffer layer 11 is formed by adopting such a stacked structure, composition ratios of the layers in the stacked structure are adjusted such that the lattice constants of a plurality of layers which form the stacked structure are incrementally changed from a lattice constant of the layer disposed below the buffer layer 11 to the lattice constant of the layer disposed above the buffer layer 11 with respect to the layers which interpose the buffer layer 11 therebetween. In this embodiment, as shown in FIG. 1, the buffer layer 11 has the stacked structure formed of an AlGaN layer 11A and an undoped GaN layer 11B, for example. "Undoped" means that a layer is not doped with a dopant intentionally. For example, a trace amount of dopant which unintentionally enters the layer during a manufacturing step or the like falls within the meaning of the term "undoped". A thickness of the GaN layer 11B is approximately 1 µm, for example.

An intermediate layer 12 is formed on the buffer layer 11. The intermediate layer 12 is a low resistance layer, and functions as a current path in the lateral direction of the device, i.e., between a source and drain region of a device. The intermediate layer 12 is made of $Al_xIn_yGa_{1-(X+Y)}N$ ($0 \leq X < 1$, $0 \leq Y < 1$, $0 \leq X+Y < 1$) doped with an n-type dopant, for example. Silicon (Si), zinc (Zn) or the like is used as the n-type dopant. In this embodiment, the intermediate layer 12 is made of GaN(n-GaN) doped with an n-type dopant or AlGaN (n-AlGaN) doped with an n-type dopant. By injecting an n-type dopant in the intermediate layer 12, a resistance of the intermediate layer 12 is reduced. Due to such reduction of the resistance of the intermediate layer 12, the intermediate layer 12 may function as a current path in the lateral direction.

The intermediate layer 12 may also be made of $Al_XIn_YGa_{1-(X+Y)}N$ ($0 \leq X < 1$, $0 \leq Y < 1$, $0 \leq X+Y < 1$) doped with a p-type dopant. Magnesium (Mg) or the like is commonly used as the p-type dopant. However, compared with silicon (Si) which is an n-type dopant, magnesium (Mg) which is a p-type dopant is easily diffused from the layer. Accordingly, when the p-type dopant is diffused into a channel layer 14 described later herein, crystallinity of the channel layer 14 is deteriorated. For this reason, it is preferable to form the intermediate layer 12 by incorporating an n-type dopant into the intermediate layer 12.

Further, an activation rate of a p-type dopant in a GaN-based material is low so that a carrier concentration of p-type dopant is merely approximately $5 \times 10^{16}$ cm$^{-3}$. On the other hand, when an n-type dopant is used, a carrier concentration may be set to approximately $1 \times 10^{19}$ cm$^{-3}$.

By adding an n-type dopant in the intermediate layer 12, a crystallinity of the intermediate layer 12 is deteriorated. For this reason, it is desirable that a thickness of the intermediate layer 12 be as thin as possible while achieving the above-mentioned function. In this embodiment, a thickness of the intermediate layer 12 is approximately 50 nm, for example. Further, the intermediate layer 12 is set to be thinner than a high resistance layer 13 described later herein.

The carrier concentration in the intermediate layer 12 is set to a value which is more than or equal to $1 \times 10^{16}$ cm$^{-3}$ and less than $1 \times 10^{19}$ cm$^{-3}$. When the carrier concentration in the intermediate layer 12 is less than $1 \times 10^{16}$ cm$^{-3}$, the resistance of the intermediate layer 12 is not sufficiently lowered to a level of acceptable conductivity. The conductivity (the reciprocal of resistivity) of a semiconductor is proportional to a product of a carrier concentration and mobility. Accordingly, a leakage current which flows in the intermediate layer 12 is lowered. On the other hand, when the carrier concentration in the intermediate layer 12 is more than or equal to $1 \times 10^{19}$ cm$^{-3}$, crystallinity of the intermediate layer 12 is deteriorated so that crystallinity of the layer above the intermediate layer 12 is also deteriorated. As a result, an electric characteristic of the semiconductor device 1 is deteriorated. Therefore, the carrier concentration of the intermediate layer 12 is more than or equal to $1 \times 10^{16}$ cm$^{-3}$ and less than $1 \times 10^{19}$ cm$^{-3}$.

Further, it is desirable that the intermediate layer 12 be made of a nitride semiconductor doped with indium (In). By incorporating indium (In) into the nitride semiconductor, the band gap of the intermediate layer 12 may be reduced. Due to the reduction of the band gap of the intermediate layer 12, the resistance of the intermediate layer 12 may be made smaller.

The high resistance layer 13 is formed on the intermediate layer 12. The high resistance layer 13 has a function of improving the breakdown voltage of the semiconductor device 1. The high resistance layer 13 mainly improves the breakdown voltage between the drain electrode 17 and the substrate 10. That is, by forming the high resistance layer 13 on the intermediate layer 12, the voltage corresponding to a resistance of the high resistance layer 13 is applied to the high resistance layer 13 and hence, the breakdown voltage of the semiconductor device 1 may be improved by an amount corresponding to the applied voltage. The high resistance layer 13 is made of $Al_XInYGa_{1-(X+Y)}N$ ($0 \leq X < 1$, $0 \leq Y < 1$, $0 \leq X+Y < 1$) doped with carbon (C). In this embodiment, the high resistance layer 13 is made of GaN (C—GaN) doped with carbon (C), for example. A thickness of the high resistance layer 13 is approximately 2 μm, for example. The resistance of the high resistance layer 13 is set as desired corresponding to a breakdown voltage which the semiconductor device 1 is expected to possess. The resistance of the high resistance layer 13 is set larger than the resistance of the intermediate layer 12.

When the channel layer 14 is stacked on the intermediate layer 12, a dopant in the intermediate layer 12 is diffused into the channel layer 14. By interposing the high resistance layer 13 between the intermediate layer 12 and the channel layer 14, the diffusion of the dopant in the intermediate layer 12 into the channel layer 14 may be suppressed. Accordingly, the occurrence of defects in the crystallinity of the channel layer 14 may be suppressed so that the lowering of carrier mobility in the channel layer 14 may be suppressed.

The channel layer 14 is formed on the high resistance layer 13. The channel layer 14 is a layer in which a channel (current path) of a transistor is formed. The channel layer 14 is made of $Al_XIn_YGa_{1-(X+Y)}N$ ($0 \leq X < 1$, $0 \leq Y < 1$, $0 \leq X+Y < 1$). The channel layer 14 is an undoped layer, and is made of a nitride semiconductor having favorable crystallinity, i.e. a high-quality crystalline structure with minimal inclusions or defects in the uniformity of the crystal lattice). In this embodiment, the channel layer 14 is made of undoped GaN (also referred to as intrinsic GaN). A thickness of the channel layer 14 is approximately 1 μm, for example.

A barrier layer 15 is formed on the channel layer 14. The barrier layer 15 is made of $Al_XInYGa_{1-(X+Y)}N$ ($0 \leq X < 1$, $0 \leq Y < 1$, $0 \leq X+Y < 1$). The barrier layer 15 is made of a nitride semiconductor having a larger band gap than the channel layer 14. In this embodiment, the barrier layer 15 is made of undoped AlGaN, for example. A composition ratio of Al in the AlGaN layer forming the barrier layer 15 is approximately 0.2, for example. A thickness of the barrier layer 15 is approximately 30 nm, for example.

The plurality of semiconductor layers forming the semiconductor device 1 are sequentially formed by an epitaxial growth using an MOCVD (Metal Organic Chemical Vapor Deposition) method, for example. That is, the plurality of semiconductor layers forming the semiconductor device 1 are formed of epitaxial layers grown one atop the other.

A source electrode 16 and a drain electrode 17 are formed on the barrier layer 15, and are spaced apart from each other. A gate electrode 18 is formed on the barrier layer 15 between the source electrode 16 and the drain electrode 17 such that the gate electrode 18 is spaced from the source electrode 16 and the drain electrode 17.

The gate electrode 18 and the barrier layer 15 form a Schottky junction. That is, the gate electrode 18 contains a material by which the gate electrode 18 forms a Schottky junction with the barrier layer 15. The semiconductor device 1 shown in FIG. 1 is a Schottky-barrier HEMT. The gate electrode 18 adopts the stacking structure of Au/Ni, for example. A material on a left side of "/" is a material for forming an upper layer, and a material on a right side of "/" is a material for forming a lower layer. The semiconductor device 1 is not limited to the Schottky-barrier HEMT, and may be an MIS (Metal Insulator Semiconductor) HEMT where a gate insulating film is interposed between the barrier layer 15 and the gate electrode 18.

The source electrode 16 and the barrier layer 15 form an ohmic contact with each other. In the same manner, the drain electrode 17 and the barrier layer 15 form an ohmic contact with each other. That is, the source electrode 16 and the drain electrode 17 respectively contain a material by which the source electrode 16 and the drain electrode 17 form an ohmic contact with the barrier layer 15. The source electrode 16 and the drain electrode 17 adopt the stacking structure of Al/Ti respectively, for example.

In the hetero junction structure formed of the channel layer 14 and the barrier layer 15, a lattice constant of the barrier layer 15 is smaller than a lattice constant of the channel layer 14 and hence, strain is generated in the barrier layer 15. Due to a piezoelectric effect generated by such a strain, a piezoelectric polarization is generated in the barrier layer 15 and hence, a two-dimensional electron gas (2DEG) is generated in a boundary of the channel layer 14 in the vicinity of the barrier layer 15. The two-dimensional electron gas forms a channel between the source electrode 16 and the drain electrode 17. Due to a Schottky barrier generated by a Schottky junction between the gate electrode 18 and the barrier layer 15, a drain current may be controlled.

Operation

Figure 2:
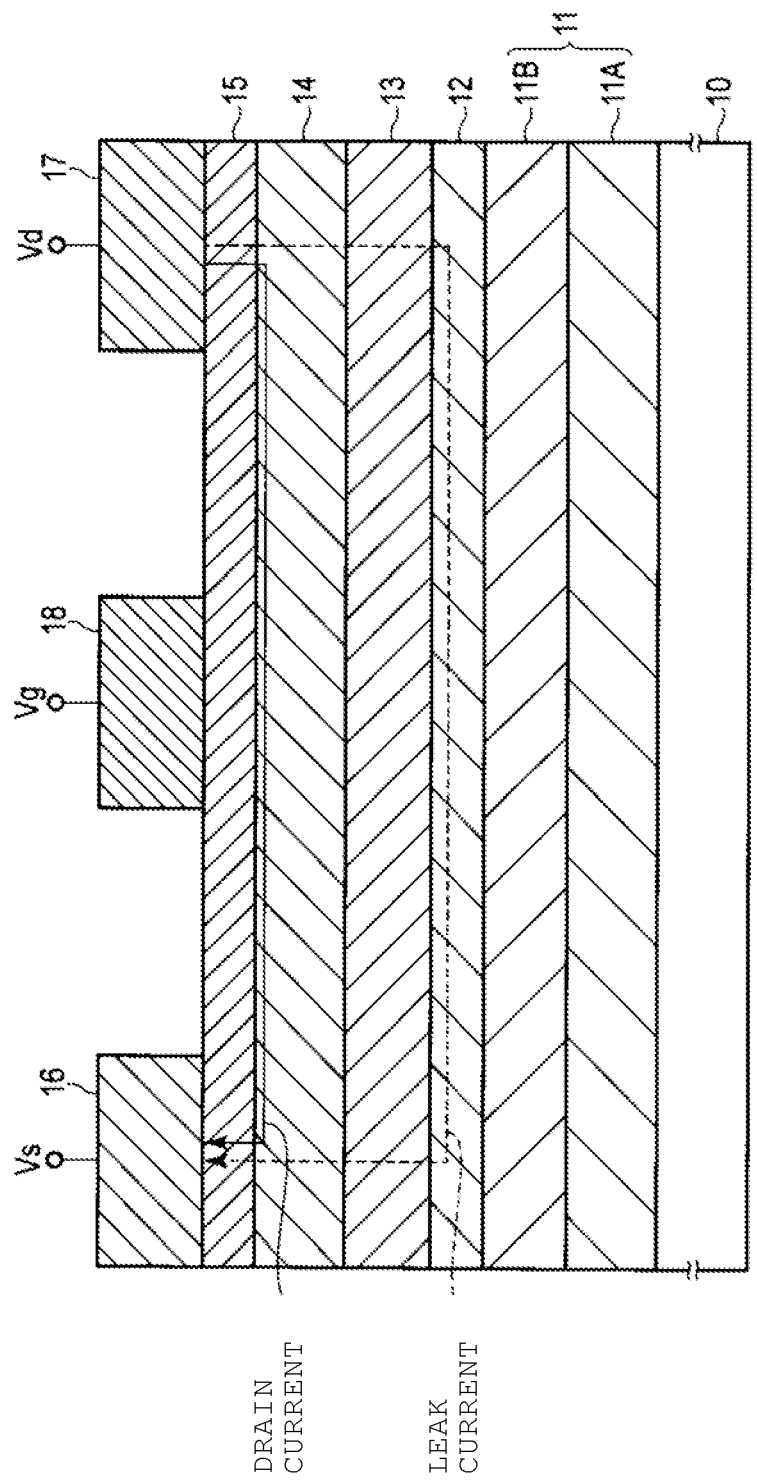
FIG. 2 is a schematic view for illustrating an operation of the semiconductor device according to the embodiment.

Next, the operation of the semiconductor device 1 formed as described above is explained. FIG. 2 is a schematic view for explaining the operation of the semiconductor device 1.

The semiconductor device 1 is a normally-on type semiconductor device, for example. The semiconductor device 1 is used as a switching element, for example. There may be a case where a high voltage of approximately 200 V to 600 V is applied to the drain electrode 17. The higher a voltage applied to the semiconductor device 1 is, the larger the leakage currents generated in the semiconductor device 1. That is, the higher the voltage applied to the semiconductor device 1, the larger the leakage current which flows between the drain electrode 17 and the substrate 10 and the larger the leakage current which flows between the drain electrode 17 and the source electrode 16.

When the semiconductor device 1 is in an ON state, for example, a gate voltage Vg of 0 V, a source voltage Vs of 0 V, and a drain voltage Vd of 200 V are applied to the semiconductor device 1. When the semiconductor device 1 is in an ON state, a drain current flows between the drain electrode 17 and the source electrode 16 through the channel formed in the channel layer 14.

When the semiconductor device 1 is in an OFF state, for example, a gate voltage Vg of −15 V, a source voltage Vs of 0 V and a drain voltage Vd of 200 V are applied to the semiconductor device 1. When the semiconductor device 1 is in an OFF state, leakage current flows between the drain electrode 17 and the source electrode 16 through the intermediate layer 12.

A broken line showing leakage current in FIG. 2 conceptually shows a path of the leakage current, and it is not always the case that leakage current flows as shown in FIG. 2. When a high voltage is applied to the drain electrode 17, an electric field is generated toward the substrate 10 from the drain electrode 17 and, at the same time, an electric field is generated toward the source electrode 16 from the drain electrode 17. Leakage current is generated corresponding to the electric field spreading from the drain electrode 17. When a path of the leakage current reaches the intermediate layer 12, the leakage current flows to the source electrode 16 through the intermediate layer 12 from a position where the path of the leakage current reaches the intermediate layer 12.

Due to such a structure, the breakdown of the semiconductor device 1 which may be caused by a high voltage applied to the drain electrode 17 may be suppressed. Particularly, since a resistance of the high resistance layer 13 is large, a high electric field is applied to the high resistance layer 13 so that breakdown of the high resistance layer 13 easily occurs. Further, when a leakage current flows into the high resistance layer 13, breakdown of the high resistance layer 13 easily occurs due to crystal defects in the high resistance layer 13. However, by making the leakage current flow through the intermediate layer 12, breakdown of the high resistance layer 13 may be suppressed.

In the case where a high voltage is applied to the drain electrode 17, it is also possible to cause leakage current flow between the drain electrode 17 and the source electrode 16 through the intermediate layer 12 even when the semiconductor device 1 is in an ON state. Accordingly, breakdown of the semiconductor device 1 may be prevented when the semiconductor device 1 is in an ON state.

Effect

As described heretofore in detail, according to this embodiment, the intermediate layer 12 made of $Al_XIn_YGa_{1-(X+Y)}N$ ($0 \leq X<1$, $0 \leq Y<1$, $0 \leq X+Y<1$) doped with an n-type dopant is provided between the buffer layer 11 and the high resistance layer 13. The intermediate layer 12 functions as a current path in the lateral direction when a high voltage is applied to the drain electrode 17.

According to this embodiment, even when a high voltage is applied to the drain electrode 17, breakdown of the semiconductor device 1 may be suppressed. That is, it is possible to create a semiconductor device 1 in which a critical voltage against the breakdown may be increased.

In this disclosure, "stack" means not only a state where layers are made to overlap with each other in a contact manner but also a state where layers are made to overlap with each other with interposing another layer therebetween. Further, "formed on" means not only a state where a layer is directly formed on a layer but also a state where a layer is formed on a layer with interposing another layer therebetween.

While certain embodiments have been described, these embodiments have been presented by way of an example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first semiconductor layer on a substrate;
    a second semiconductor layer containing an n-type dopant, on the first semiconductor layer;
    a third semiconductor layer having a resistance greater than the second semiconductor layer, on the second semiconductor layer;
    a fourth semiconductor layer containing a nitride semiconductor, on the third semiconductor layer; and
    a fifth semiconductor layer containing a nitride semiconductor and having a band gap greater than the fourth semiconductor layer, on the fourth semiconductor layer, wherein
    the third semiconductor layer includes a nitride semiconductor containing carbon.

2. The semiconductor device according to claim 1, wherein a carrier concentration of the second semiconductor layer is greater than or equal to $1 \times 10^{16}$ cm$^{-3}$ and less than $1 \times 10^{19}$ cm$^{-3}$.

3. The semiconductor device according to claim 1, wherein the second semiconductor layer contains a material made of $Al_XIn_YGa_{1-(X+Y)}N$ (0≤X<1, 0≤Y<1, 0≤X+Y<1).

4. The semiconductor device according to claim 1, wherein the second semiconductor layer contains the same semiconductor material as the first semiconductor layer.

5. The semiconductor device according to claim 1, wherein the first semiconductor layer contains a material made of $Al_XGa_{1-X}N$ (0≤X≤1).

6. The semiconductor device according to claim 1, wherein the second semiconductor layer is thinner than the third semiconductor layer.

7. The semiconductor device according to claim 1, wherein the second semiconductor layer is n-doped.

8. The semiconductor device according to claim 1, wherein the fourth semiconductor layer is intrinsic GaN.

9. A semiconductor device, comprising:
a first semiconductor layer on a substrate;
a second semiconductor layer containing an n-type dopant, on the first semiconductor layer;
a third semiconductor layer having a resistance greater than the second semiconductor layer, on the second semiconductor layer;
a fourth semiconductor layer containing a nitride semiconductor, on the third semiconductor layer;
a fifth semiconductor layer containing a nitride semiconductor having a band gap greater than the fourth semiconductor layer, on the fourth semiconductor layer; and
source and drain electrodes on the fifth semiconductor layer,
wherein the fourth semiconductor layer forms a channel region of the semiconductor device between the source and drain electrodes, and
wherein the second semiconductor layer forms a leakage current pathway between the source and drain electrodes.

10. The semiconductor device according to claim 9, wherein a carrier concentration of the second semiconductor layer is greater than or equal to $1\times10^{16}$ cm$^{-3}$ and less than $1\times10^{19}$ cm$^{-3}$.

11. The semiconductor device according to claim 9, wherein the second semiconductor layer contains a material made of $Al_XIn_YGa_{1-(X+Y)}N$ (0≤X<1, 0≤Y<1, 0≤X+Y<1).

12. The semiconductor device according to claim 9, wherein the second semiconductor layer contains the same semiconductor material as the first semiconductor layer.

13. The semiconductor device according to claim 9, wherein the first semiconductor layer contains a material made of $Al_XGa_{1-X}N$ (0≤X≤1).

14. The semiconductor device according to claim 9, wherein the third semiconductor layer includes a nitride semiconductor containing carbon.

15. The semiconductor device according to claim 9, wherein the second semiconductor layer is thinner than the third semiconductor layer.

16. The semiconductor device according to claim 9, wherein the second semiconductor layer is n-doped.

17. A method of directing current through a semiconductor device, comprising:
providing a first semiconductor layer on a substrate;
providing a second semiconductor layer containing an n-type dopant, on the first semiconductor layer;
providing a third semiconductor layer having a resistance greater than the second semiconductor layer, on the second semiconductor layer;
providing a fourth semiconductor layer containing a nitride semiconductor, on the third semiconductor layer;
providing a fifth semiconductor layer containing a nitride semiconductor having a band gap greater than the fourth semiconductor layer, on the fourth semiconductor layer;
providing source and drain electrodes on the fifth semiconductor layer; and passing leakage current through the second semiconductor layer.

18. The method of 17, wherein a carrier concentration of the second semiconductor layer is greater than or equal to $1\times10^{16}$ cm$^{-3}$ and less than $1\times10^{19}$ cm$^{-3}$.

19. The semiconductor device according to claim 1, further comprising:
a source electrode on the fifth semiconductor layer;
a drain electrode on the fifth semiconductor layer spaced from the source electrode; and
a gate electrode on the fifth semiconductor layer between the source and drain electrodes, wherein
the first semiconductor layer is a buffer layer comprising at least one aluminum gallium nitride sub-layer and at least one gallium nitride sub-layer,
the second semiconductor layer is n-doped aluminum indium gallium nitride layer having a carrier concentration between $1\times10^{16}$ cm$^{-3}$ and $1\times10^{19}$ cm$^{-3}$,
the third semiconductor layer is carbon-doped gallium nitride having a total layer thickness greater than a total layer thickness of the second semiconductor layer,
the fourth semiconductor layer is intrinsic gallium nitride, and
the fifth semiconductor layer is intrinsic aluminum gallium nitride.

20. The semiconductor device according to claim 9, further comprising:
a gate electrode on the fifth semiconductor layer between the source and drain electrodes, wherein
the first semiconductor layer is a buffer layer comprising at least one aluminum gallium nitride sub-layer and at least one gallium nitride sub-layer,
the second semiconductor layer is an aluminum indium gallium nitride layer having a carrier concentration between $1\times10^{16}$ cm$^{-3}$ and $1\times10^{19}$ cm$^{-3}$,
the third semiconductor layer is carbon-doped gallium nitride having a total layer thickness greater than a total layer thickness of the second semiconductor layer,
the fourth semiconductor layer is intrinsic gallium nitride, and
the fifth semiconductor layer is intrinsic aluminum gallium nitride.

* * * * *